(12) United States Patent
Mann et al.

(10) Patent No.: US 7,914,955 B2
(45) Date of Patent: Mar. 29, 2011

(54) MASKS, LITHOGRAPHY DEVICE AND SEMICONDUCTOR COMPONENT

(75) Inventors: Hans-Juergen Mann, Oberkochen (DE); Martin Lowisch, Oberkochen (DE); Wolfgang Singer, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 12/498,226

(22) Filed: Jul. 6, 2009

(65) Prior Publication Data

US 2009/0268189 A1    Oct. 29, 2009

Related U.S. Application Data

(63) Continuation of application No. 10/572,149, filed as application No. PCT/EP03/10338 on Sep. 17, 2003, now Pat. No. 7,572,556.

(51) Int. Cl.
*G03F 1/00* (2006.01)

(52) U.S. Cl. .......................................................... 430/5

(58) Field of Classification Search .............. 430/5, 311; 378/35; 355/53
See application file for complete search history.

(56) References Cited

U.S. PATENT DOCUMENTS

| | | | |
|---|---|---|---|
| 5,458,084 A | 10/1995 | Thorne et al. | |
| 6,243,203 B1 * | 6/2001 | Schleipen et al. | 359/581 |
| 6,333,961 B1 | 12/2001 | Murakami | |
| 7,042,550 B2 * | 5/2006 | Lowisch et al. | 355/53 |

| | | | |
|---|---|---|---|
| 2002/0142230 A1 | 10/2002 | Yan et al. | |
| 2003/0026383 A1 | 2/2003 | Michaelsen et al. | |
| 2003/0222225 A1 | 12/2003 | Shiraishi | |

FOREIGN PATENT DOCUMENTS

| | | |
|---|---|---|
| EP | 0 600 708 | 6/1994 |
| EP | 1 282 011 | 2/2003 |
| EP | 1 367 605 | 12/2003 |
| EP | 1 367 605 A1 | 12/2003 |
| JP | 04169898 | 6/1992 |
| JP | 2003-014893 A | 1/2003 |
| WO | 01/07967 | 2/2001 |
| WO | 01/09681 | 2/2001 |
| WO | 02/00608 | 1/2002 |
| WO | 2005 015314 | 2/2005 |

OTHER PUBLICATIONS

M. Singh, et al., Design of multilayer extreme-ultraviolet mirrors for enhanced reflectivity, Applied Optics, May 1, 2001, vol. 39, No. 13, pp. 2189-2197, XP 000940136.

* cited by examiner

*Primary Examiner* — Stephen Rosasco
(74) *Attorney, Agent, or Firm* — Sughrue Mion, PLLC

(57) ABSTRACT

One problem of projection optics concerns pupil apodization which leads to imaging defects. As here proposed, the illumination system is configured to illuminate the mask inhomogeneously. As a result, inhomogeneities in reflectivity caused by the mask itself are at least partly counteracted. This compensation not only makes the apodization over the pupil become more symmetric but also makes the intensity variation smaller overall.

15 Claims, 11 Drawing Sheets

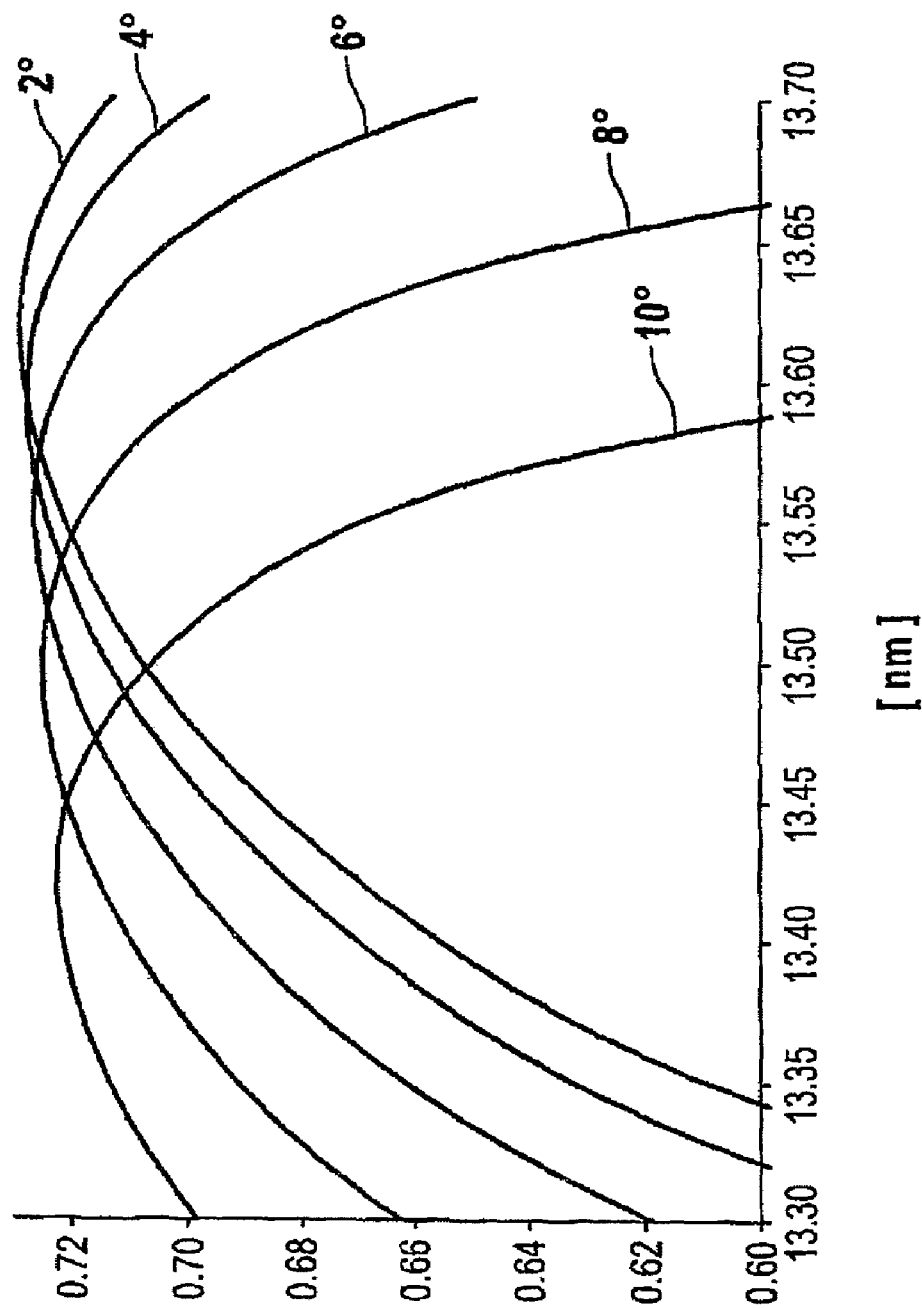

MASKS, LITHOGRAPHY DEVICE AND SEMICONDUCTOR COMPONENT

This is a continuation of application Ser. No. 10/572,149 filed Nov. 3, 2006, which is a National Stage Application filed under §371 of PCT Application No. PCT/EP03/10338 filed Sep. 17, 2003. The entire disclosures of the prior applications, application Ser. Nos. 10/572,149 and PCT/EP03/10338, are hereby incorporated by reference.

FIELD OF THE INVENTION

The invention concerns masks with a multilayer coating having a period thickness distribution d(x,y,z). Moreover, the invention concerns a lithography device and a semiconductor component.

BACKGROUND OF THE INVENTION

Semiconductor components are generally produced by means of lithography techniques. For this, structures dictated by a mask are projected onto a substrate by means of illumination and projection systems. Generally, light with wavelengths in the UV region is used for this. In the course of the ongoing miniaturization of semiconductor components, wavelengths in the extreme ultraviolet region (EUV) and in the soft x-ray region are being adopted. This spectrum corresponds to wavelengths in the region of 1 to 20 nm.

At these wavelengths, the mask can no longer work by transmission, since there is no transparent material for these wavelengths. One uses masks which work by reflection. In order to assure a reflection, the masks have a multilayer coating. Such multilayers are built up from periodic repetitions, in the most elementary case a period consisting of two layers. Generally, one material of the layer should have the highest possible index of refraction and low absorption, while the other layer material should have the lowest possible index of refraction. The layer with the high index of refraction and low absorption is also known as a spacer, the layer with low index of refraction is also called the absorber. In the EUV range, gem silicon with an index of refraction of 1.0 is used as the spacer and molybdenum with an index of refraction of 0.92 as the absorber. The period thickness and the thickness of the individual layers are chosen in dependency on the operating wavelength, the mean angle of incidence, and the angle bandwidth of the incident radiation so that the reflectivity integrated over the illuminated surface is maximized at the operating wavelength.

Multilayer coatings act as a Bragg reflector, so that one observes a reflectivity depending on the angle of incidence. This becomes noticeable, e.g., in the form of a nonhomogeneous intensity distribution in the pupil of projection optics, the so-called pupil apodization. For it is not technically possible to produce illumination sources and illumination systems providing only precisely one angle of incidence. Furthermore, such so-called coherent illuminations only permit the imaging of gross structures, whereas one can resolve and correspondingly portray finer structures with partially coherent or incoherent illumination systems. Such illumination systems have a finitely opened cone of illumination rays. The pupil apodization can result in imaging errors, such as inhomogeneous intensity when projecting the mask structure onto a substrate, telecentric errors, and structure-dependent or field-dependent limits of resolution (so-called HV differences or CD variations).

EP 1 282 011 A2 shows ways of minimizing the apodization by measures taken for the projection system. The projection objective proposed there for imaging a pattern arranged in an object plane into an image plane by means of electromagnetic radiation from the EUV range has several imaging mirrors provided with multilayer coatings between the object plane and the image plane, defining one optical axis of the projection objective. At least one of the mirrors has a graduated multilayer coating with a layer thickness varying in rotational symmetry to an axis of coating, while the axis of coating is arranged eccentrically to the optical axis of the projection objective. This takes care of the problem of pupil apodization, i.e., the strong fluctuation in intensity over the pupil, since one works with a rotationally symmetrical apodization. As a result, the apodization is almost independent of the field. This is achieved in that the projection objective has two mirrors with centered and graduated multilayer coating, and the two multilayer coatings are appropriately coordinated with each other.

U.S. Pat. No. 6,333,961 B1 concerns itself with lessening the influence of the bandwidth of the source spectrum on the lithographic imaging. The reflective mask is employed in the soft x-ray wavelength region, and the reflection occurs on a multilayer coating. It is proposed to vary the period thickness of the multilayer coating over the depth of the coating. Thanks to this thickness variation, the reflectivity profile becomes broader, depending on the angle of incidence or the wavelength. This has the effect that the lithographic imaging becomes less sensitive to fluctuations in the angle of incidence and the wavelength. The thickness variation can be continuous or occur in stages over the depth of the coating.

SUMMARY OF THE INVENTION

The problem of the present invention is to propose measures enabling a reduction in the imaging errors due to apodization effects.

This problem is solved by masks, a lithography device, and a semiconductor component according to the claims.

Surprisingly, it turns out that if one backs off a little from the rule of optimizing the reflectivity of the mask for the operating wavelength, and selects the period thickness d(x,y,z) larger in at least one place than the period thickness $d_{ideal}$ at which maximum reflectivity would occur for the operating wavelength, the reflectivity profile on the mask is modified to the extent that the apodization not only becomes more symmetrical, and thus telecentric errors are diminished, but also the intensity variation caused overall by the apodization is diminished.

Contrary to the teaching of U.S. Pat. No. 6,333,961 B1, one need not resort to costly depth-graduated multilayer coatings for this. It has been found that significant improvements can even be achieved with period thickness distributions d(x,y) that are constant over the depth. In any case, however, one can additionally design the multilayer coating as a depth gradient, in order to increase the bandwidth of reflection at the mask according to the invention.

In an especially preferred embodiment, the period thickness d(x,y,z) is greater than $d_{ideal}$ over the entire surface of the reticle, i.e., in the x-y plane. This has proven to be especially advantageous for large-area masks.

Most especially preferred is a constant period thickness d(x,y,z) over the entire mask surface and especially for the entire coating. This results in a great simplification not only for the design of the multilayer coating, but also for the fabrication of the mask. Namely, it has been discovered that even a slight enlargement of the period thickness by a constant amount over the entire mask surface can achieve a symmetrical apodization with little intensity fluctuation and only slight loss in terms of overall reflectivity.

Good results are also achieved when one selects the period thickness such that the reflectivities are the same for the aperture boundary rays of a given illumination aperture. If, say, α0 is the angle of incidence of the principal ray of the illumination aperture Na$_{illuminator}$ and Δα=arcsin (NA$_{illuminator}$) is the corresponding half-aperture angle of the illumination aperture, the period thickness according to the invention should be chosen so that the reflectivity fulfills the following relation, depending on the angle of incidence at the operating wavelength: R(α0+Δα)=R(α0−Δα). The choice of the corresponding period thickness can be done, for example, by an iteration process. Then, only in the limit case of coherent illumination (Δα→0) will there be an agreement with the usual choice of period thickness d(x,y,z)=d$_{ideal}$. Especially preferred is the case d(x,y,z)>d$_{ideal}$ in at least one place (x$_0$, y$_0$, z$_0$).

The improvements obtained by using the invented masks in lithography devices can be further strengthened if the illumination system is designed so that the exit pupil of the illumination system is deliberately illuminated inhomogeneously. Thanks to this combination of measures for the illumination system, as well as for the mask, the pupil apodization can be effectively minimized.

Even lithography devices working with traditional masks in transmission in the UV region exhibit a reduced pupil apodization when the illumination system is designed so that the exit pupil of the illumination system is deliberately illuminated inhomogeneously, so that apodization effects, especially those caused by the mask in the beam path, are at least partly compensated.

Advantageously, the inhomogeneous illumination as a function of the field point is adapted to the angle of incidence per field. The correction measures can be undertaken by means of optical components arranged in front of the mask in the beam path.

It has proven to be especially effective to employ at least one filter for this. The actual masks may have reflectivities which deviate from the ideal reflectivity, or they may have additional effects caused by diffraction structures which influence the pupil illumination. For example, there might be illumination-dependent diffraction efficiencies for object structures in the mask containing the structure. These can be compensated by suitable filters. For example, individual sub-pupils can be influenced according to field position by a honeycomb filter. One can change the filter according to the mask being used. For this, one can use a filter wheel, for example. Suitable filters are described, e.g., in DE 103 34 722.4.

Moreover, further symmetry can be achieved for the pupil apodization by providing at least one optical element with centered, graduated multilayer coating in addition in the projection system, as is described in EP 1 282 011 A2. The graduated multilayer coating will preferably be optimized to compensate for the residual apodization of the pupil, especially that caused by reflection on the mask. For further symmetry in the apodization, two or more optical elements can be employed with substantially centered graduated multilayer coating, with the multilayer coating of the individual optical elements being attuned to each other.

Thanks to the lithography devices as described, semiconductor components can be fabricated by structuring of a substrate.

BRIEF DESCRIPTION OF THE DRAWINGS

The invention shall now be explained more closely by means of drawings. These show:

FIG. 5 the reflectivity as a function of the wavelength and the angle of incidence for a mask according to the invention, and FIG. 6a-e the pupil apodization resulting from reflection at a mask according to the invention at five different field points.

DETAILED DESCRIPTION OF THE INVENTION

Figure 1A:
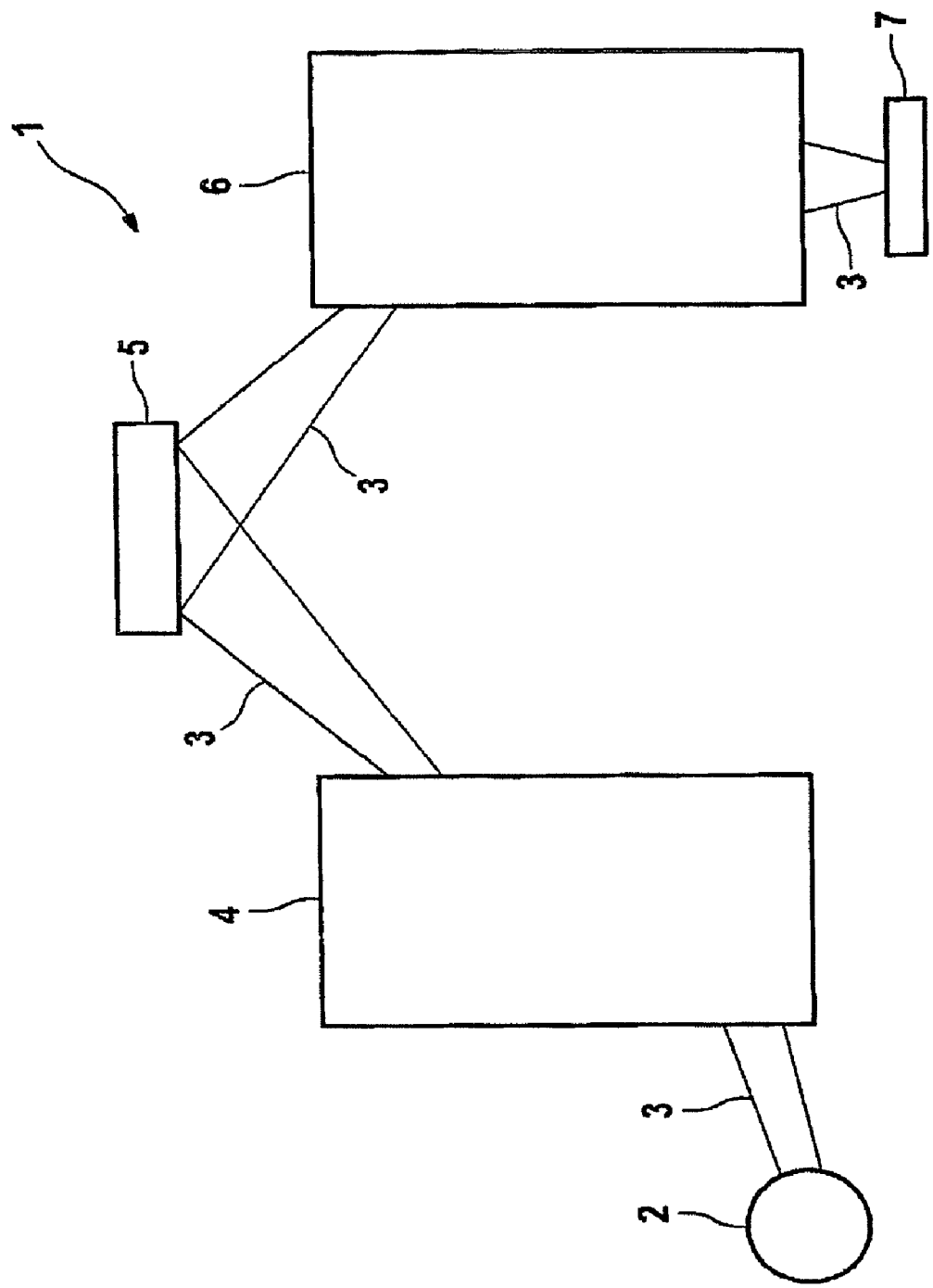
FIG. 1a a basic layout of an EUV lithography device.

FIG. 1a shows an EUV lithography device 1 for fabrication of semiconductor components by structuring of a substrate 7. A beam 3 arriving from the light source 2 is taken to an illumination system 4, which deflects the beam 3 onto a mask 5 so that it is illuminated. At the mask 5, the EUV beam 3 is diffracted by reflection and taken to the projection system 6, which deflects the EUV beam 3 onto the substrate 7, whereby the structure existing on the surface of the mask is projected onto the substrate 7.

Figure 2:
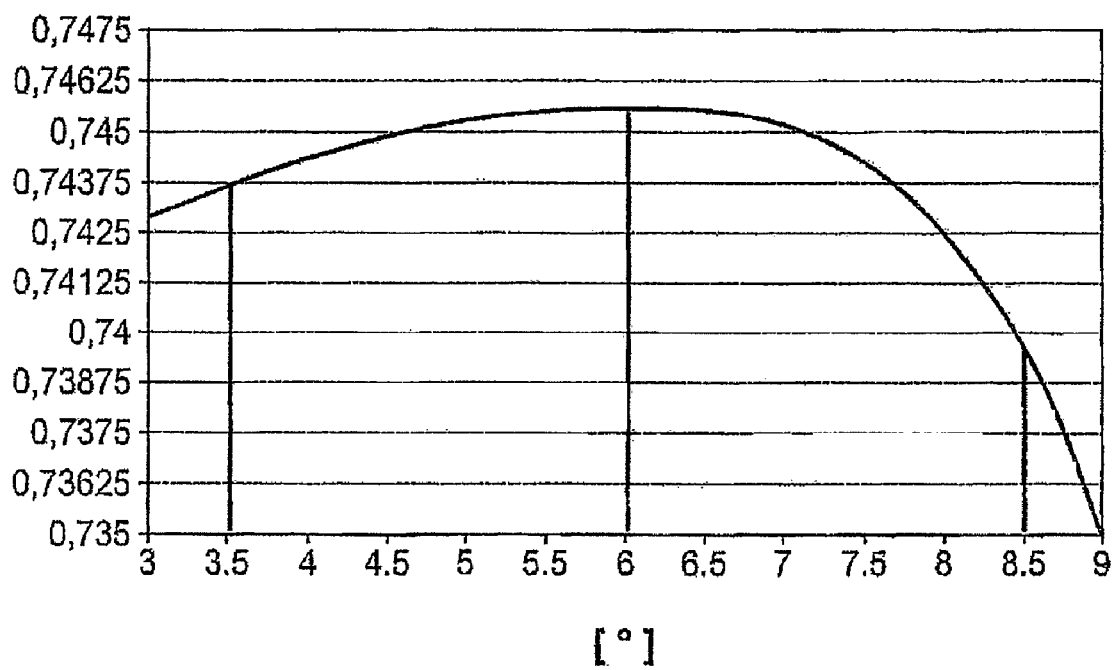
FIG. 2 the reflectivity as a function of the angle of incidence for a wavelength of 13.5 nm.

FIG. 2 shows the reflectivity as function of the angle of incidence for an operating wavelength of 13.5 nm. The central principal ray angle is 6°. Here, a maximum reflectivity of around 74.6% is achieved. However, EUV light also impinges on the mask 5 at marginal ray angles between 3.5° and 8.5°. There, only reflectivities of around 74.3% and 73.9%, respectively, are achieved. Thus, the reflectivity fluctuates quite substantially for different angles of incidence. A further complication is that this fluctuation does not occur symmetrically to the central principal ray angle. This results in a pupil apodization and imaging errors in the form of telecentric errors, CD variations, and so-called H-V differences. These are variations in structure width between the imaging elements of horizontal and vertical structures laid out with identical width on the masks.

If, as shown above, an inhomogeneous pupil illumination or so-called apodization occurs due to the angle-dependent reflectivity on the mask 5, this can be at least partly compensated by an appropriate prediction of the distribution of intensity of the illumination light over the illumination angle at a particular field point. For this, one determines, for example, using the generally familiar method of ray trace-back, that intensity distribution over the angle of illumination at which a homogeneously illuminated pupil on the wafer substrate 7 will occur after reflection by the mask 5 and passage through the projection optics, i.e., with no deviation from the desired telecentrism. Moreover, it is conceivable to allow for the angle-dependent diffraction efficiencies of structures being imaged on the reflection mask 5, in addition to the angle-dependent reflectivity. To achieve an optimal compensation, the compensation can be adapted to a particular preferred or predominantly occurring structure width and orientation by using an interchangeable filter element.

In the following, FIG. 1b shall be used as an example to explain the compensation by filter of apodization effects induced by the mask. This is done on the example of a projection illuminating layout with an illumination system 206 having a honeycomb condenser 1000, 1002.

The basic EUV projection illumination layout is explained at length in WO 02/00608, the full disclosure of which is hereby incorporated into the present application by reference.

Figure 1B:
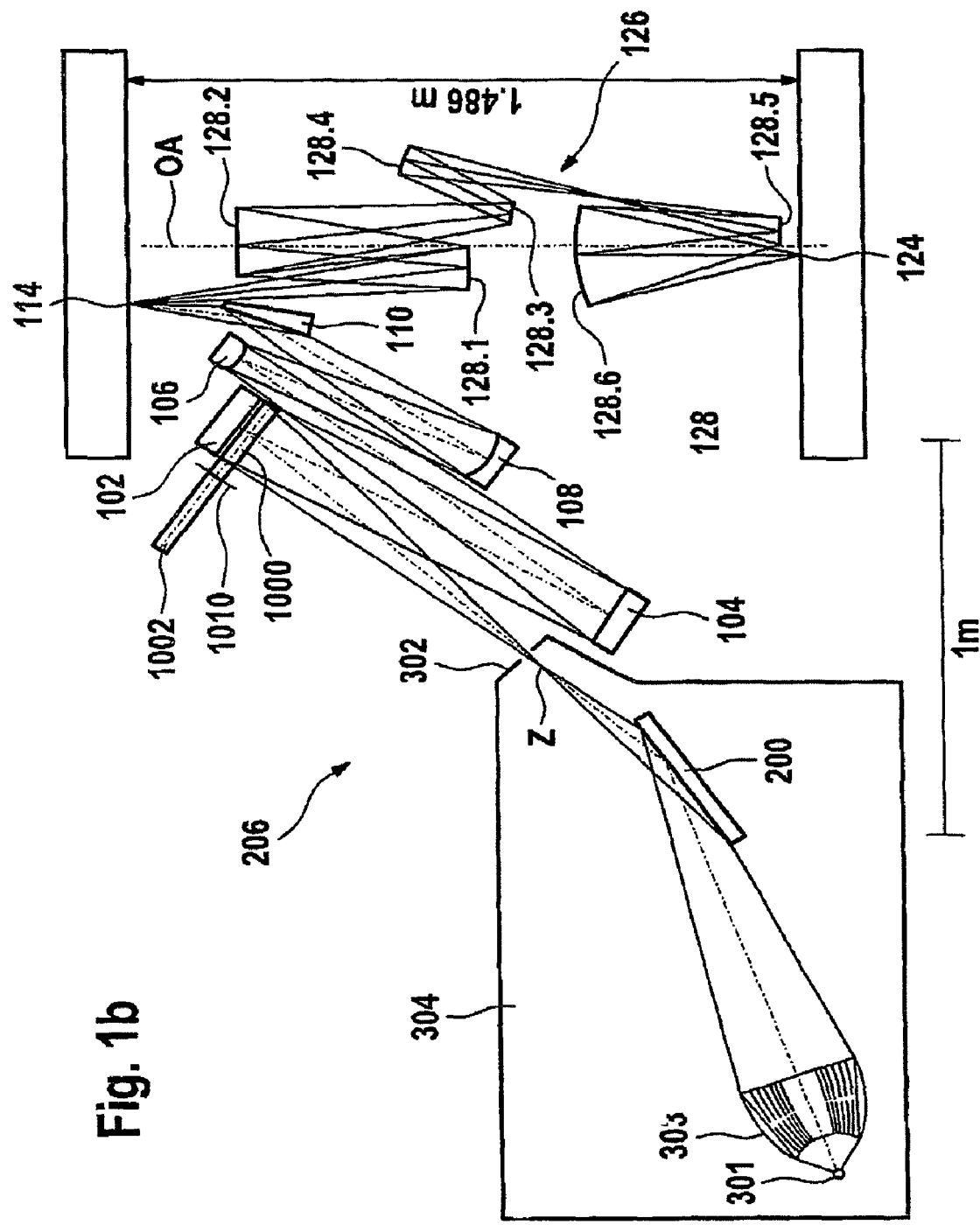
FIG. 1b a detailed sketch of an EUV lithography device.

The EUV projection illumination layout of FIG. 1b comprises an illumination system 206 with a diffractive spectral filter 200, realized for example by a lattice. Thus, together with the diaphragm 302 in the neighborhood of the intermediate image Z of the light source 301, unwanted radiation with wavelengths substantially larger than the desired wavelength, in the present case 13.5 nm, can be prevented from entering the portion of the illumination system coming after the diaphragm 302.

The diaphragm 302 also serves to separate the space 304 with light source 1, collector 303, and lattice 200 from the following elements of the illumination system 206. By installing a valve near the intermediate focus Z, a pressure separation is also possible. The separation by space or pressure can prevent impurities deriving from the light source 301 from getting into the portion of the illumination system coming after the diaphragm 302. The collector 303 used here is nested with eight shells.

After the diaphragm 302 are arranged a first, second, third, fourth and fifth optical element 102, 104, 106, 108, 110. The first optical element 102 comprises 122 first grid elements with a dimension of 54 mm×2.75 mm each. The second optical element 104 has at least 122 second grid elements with a diameter of 10 mm each, coordinated with the first grid elements.

Each of the first grid elements, which are projected into the object plane 114 and whose projecting elements are superimposed there, are coordinated with second grid elements. Thus, the intensity occurring at a first grid element corresponds to the intensity of the coordinated second grid element, which in turn corresponds to an illumination angle in the object plane 114.

Directly in front of the first grid elements 102 is arranged the correction filter 1000. For example, it is located in a filter wheel which can turn about an axis of rotation 1010 so as to exchange it for another correction filter 1002, adapted to different projected structural widths or orientations on the mask. A standardized filter element with an active component is another conceivable configuration. The filter 1000 can also be arranged after the second optical element 104 or between the first and the second optical element 102, 104.

The filter 1000 for correcting the apodization effect as a function of the field position is designed so that the radiation flux is weakened in front of certain first grid elements, which correspond by the coordination with certain second grid elements to certain illumination angles at particular field locations, so that a homogeneous scan-integrated field and pupil illumination is produced in the image space of the projection illumination layout over all illumination angles after reflection by the mask.

The second grid elements of the second optical element 104 are projected via the mirrors 106, 108 and 110 into the entry pupil of the following projection objective 126 with six mirrors 128.1, 128.2, 128.3, 128.4, 128.5, 128.6. The projection objective 126 projects the annular field in the object plane 114 into an image field in an image plane 124, where the object being illuminated is situated, such as a wafer. The structure-carrying mask is arranged in the object plane 114.

In a first variant (not shown) of the projection objective 126, mirror 128.2 has a graduated, decentralized multilayer coating which is symmetrical about the axis of coating. In a second variant (not shown) of the projection objective 126, the mirrors 128.4 and 128.5 have an essentially centered, graduated multilayer coating, and both coatings are attuned to each other. These projection objective variants result in a further reduction in the pupil apodization, in addition to the use of a mask according to the invention, which is explained in detail further below.

The mirror 110 of the illumination system 206 serves to form the annular field in the object plane 114 and consists of an off-axis segment of a hyperboloid of revolution. The system shown in FIG. 1b is designed for a field radius of R=130 mm with an illumination aperture of NA=0.03125 in the object plane 114, i.e., at the mask. This corresponds to a filling ratio of σ=0.5 in the entry pupil of a following 4:1 projection objective with an aperture NA=0.25 in the plane 124.

The angle of incidence at the mask (in the object plane 114) usually depends on the particular field position, especially when there is no telecentric beam path at the mask, as in reflective EUV projection illumination layouts. If an apodization of the pupil and/or an inhomogeneous illumination of the image plane 124 exists on account of the angle-dependent reflectivity of the mask, it is possible to compensate for this apodization or nonuniform illumination of the image plane, for example, by partial obscuring of the honeycomb channels of a honeycomb condenser. For this, one attenuates the intensity of the illumination directions, which are reflected with a higher reflectivity by the mask, at the corresponding field and pupil locations. The honeycomb condenser (not shown) is mounted at the second grid elements of the second optical element 104. This enables a constant changing of the distribution of intensity over all field positions. If one also wishes to compensate for apodization effects dependent on field position, this is done by the filter 1000 arranged in front of the first optical element 102, as already described.

For the imaging in a scanning projection illumination layout, in which the mask and the object being illuminated, such as a wafer, move in synchronization with each other during the illumination process, it is only necessary for the illumination of the image field and the pupil integrated in the scanning process to be largely homogeneous. In the layout shown in FIG. 1b, telecentrism errors of less than 10 mrad on the wafer and intensity fluctuations of less than 0.5% are customary.

While the projection illumination layout shown in FIG. 1b projects the first grid elements of the first optical element 102, also known as field honeycombs, directly into the object plane 114, projection illumination layouts in which the first grid elements are first projected as an intermediate image and then into the object plane 114 by optics placed afterwards in the beam path are also possible. Such an illumination system is described at length in WO 01109681, the full disclosure of which is hereby incorporated into the present application by reference.

Figure 3:
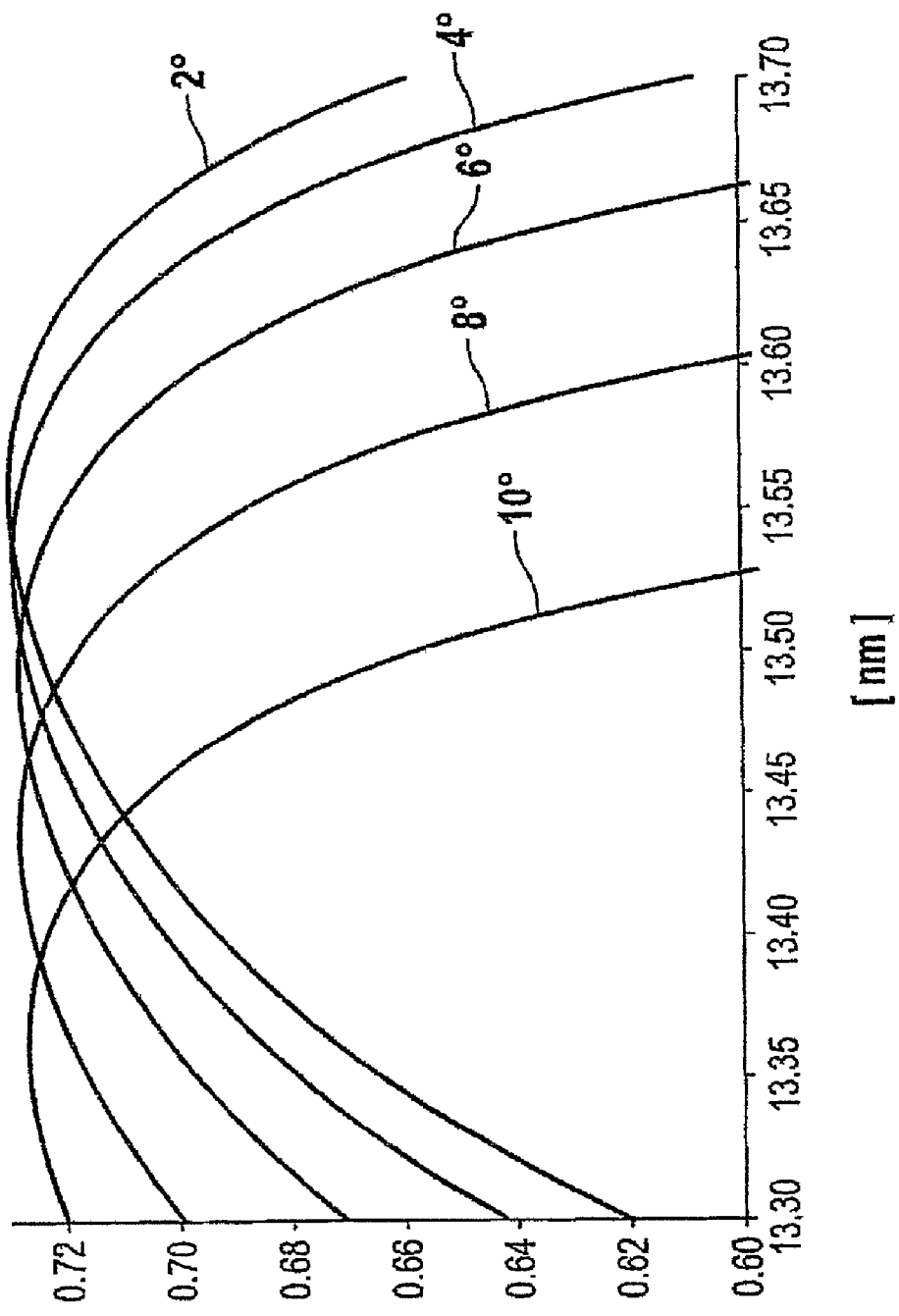
FIG. 3 the reflectivity as a function of the wavelength and the angle of incidence for a traditional mask.

In FIG. 3, the reflectivities for different angles of incidence from 2° to 10° are plotted against the wavelength. The traditional mask used here is optimized for an operating wavelength of 13.5 nm and a principal ray angle of 6°. This mask has a molybdenum/silicon multilayer coating with a period thickness of $d_{ideal}$=6.948 nm.

FIGS. 4a-e show the resulting pupil apodization for five different field points in relative pupil coordinates. The precise values are summarized in Table 1. One also notices the trend of the apodization in the exit pupil, which is distinctly asymmetrical. Furthermore, the reflectivity is subject to strong variation and takes on values between 66.42% to 68.20% and 72.78%.

In comparison, FIGS. 5 and 6a-e show the corresponding situation for a mask according to the invention. The mask of the invention also has a molybdenum/silicon multilayer coating. However, the period thickness here was chosen as constant 6.976 nm. For the reflectivity as a function of the angle of incidence, this means that the reflectivity is now a maximum at an angle of incidence of around 8°, instead of 6°, at the operating wavelength of 13.5 nmn.

The improvements with respect to the apodization in the exit pupil are very obvious, as shown in FIG. 6a-e for the same field points as in FIG. 4a-e (also see Table 2). First, a saddle surface is formed in the exit pupil, having a much greater symmetry than the apodization of the traditional reticle. Furthermore, the reflectivity now only varies between 71.18% to 70.50% and 72.55% across the exit pupil. Moreover, it is advantageous that the reflectivity at operating wavelength of 13.5 mn is practically identical for angle of incidence of 2° and 10°. Hence, this reticle is especially suitable for use in lithography devices with projection systems with an illumination aperture of 4°. For in this case, the angle of incidence varies between 6°±4°=2° to 10°. Therefore, the drop in reflectivity at the upper and lower pupil margin is practically symmetrical. It should be pointed out that the choice of the principal ray angle of 6° and the choice of the illumination aperture angle of 4° should merely be considered a sample embodiment of the notion of the invention, but the notion of the invention itself is not limited to this sample embodiment and can be easily adapted to the particular lithography optics.

Moreover, it should be noted that satisfactory results with regard to the apodization in the present example are achieved in a period thickness range of around 6.962 nm to 6.990 nm.

TABLE 1

Figure 4A:
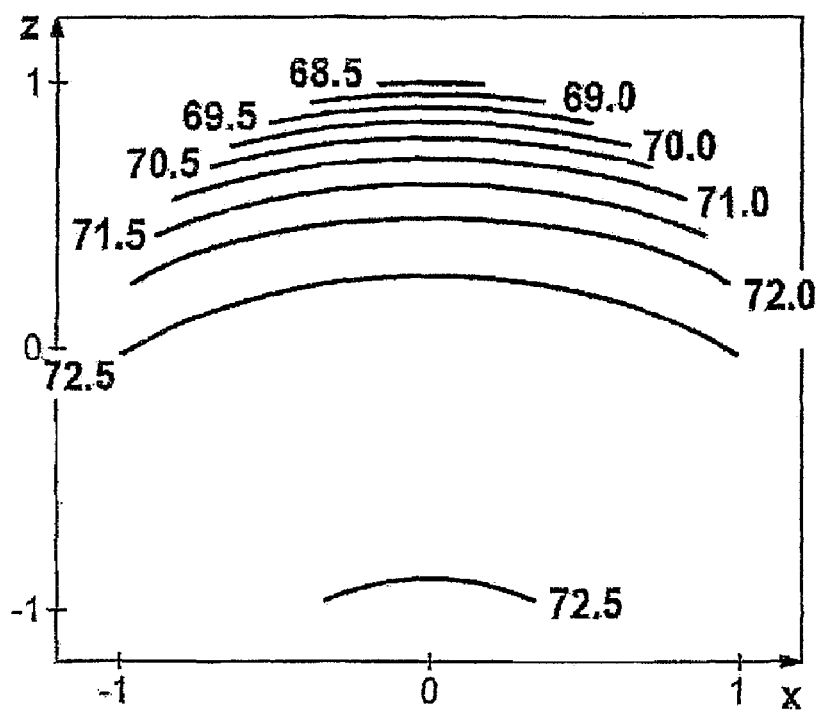
FIG. 4a-e the pupil apodization resulting from the reflection at the traditional mask at five different field points.
Figure 4B:
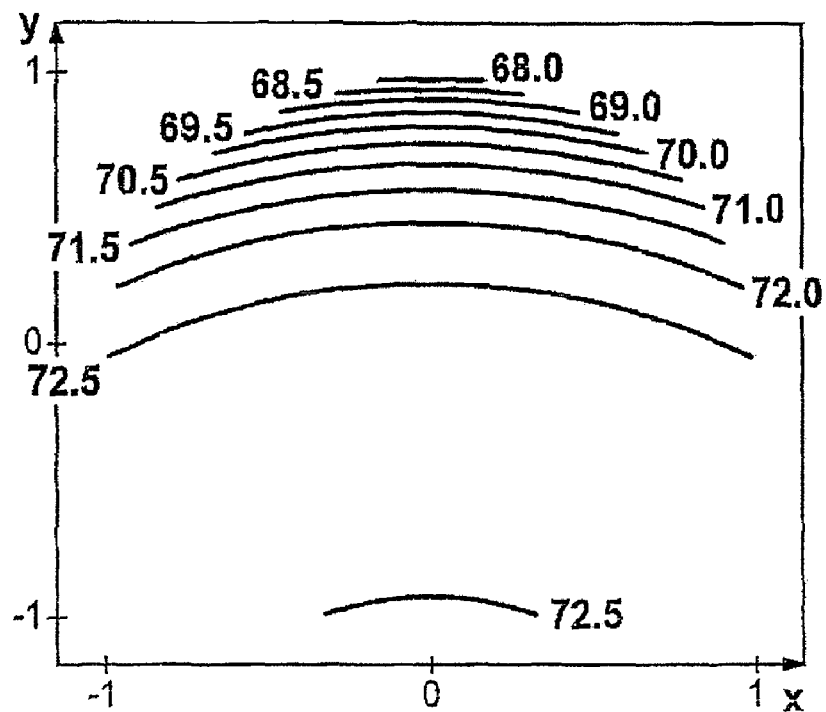
Figure 4C:
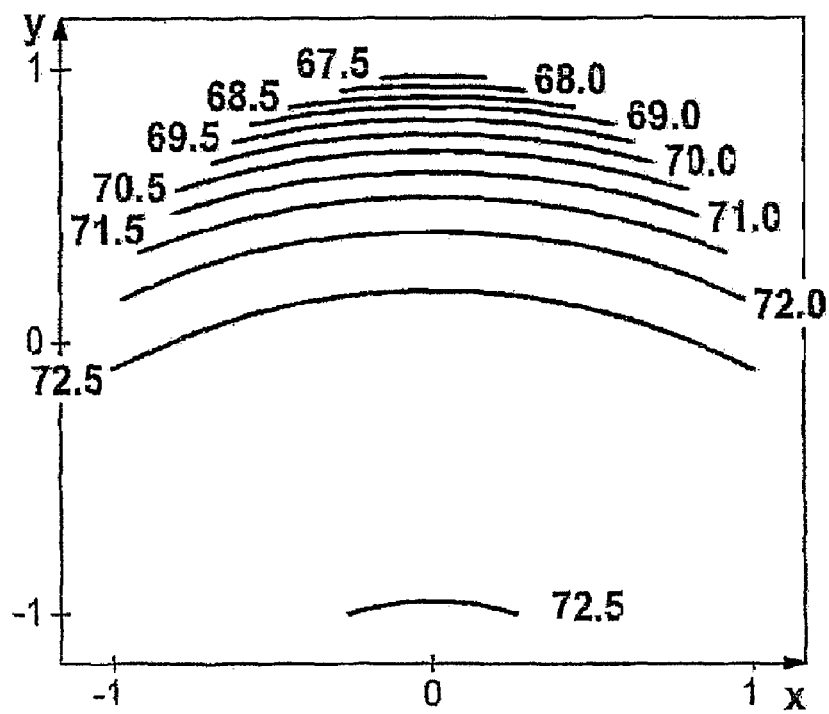
Figure 4D:
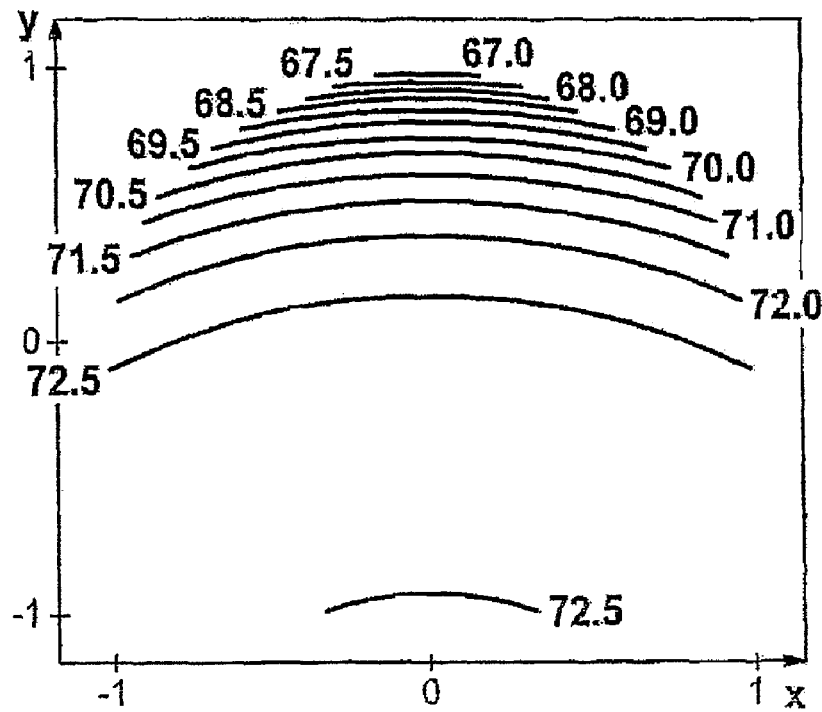
Figure 4E:
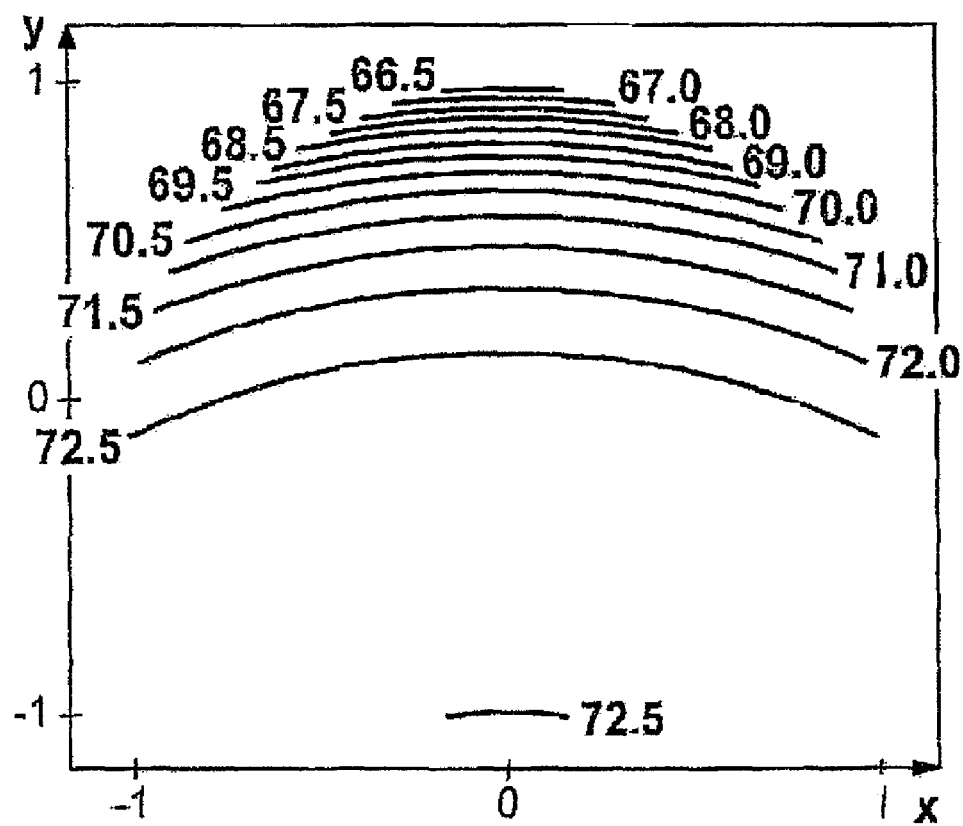

|  | FIG. 4a | FIG. 4b | FIG. 4c | FIG. 4d | FIG. 4e |
| --- | --- | --- | --- | --- | --- |
| Relative field coordinate | (0.00; 0.94) | (0.00; 0.95) | (0.00; 0.97) | (0.00; 0.98) | (0.00; 1.00) |
| Angle | 5.8° | 5.9° | 6.0° | 6.1° | 6.2° |
| Minimum reflectivity (%) | 68.20 | 67.81 | 67.38 | 66.92 | 66.42 |
| Maximum reflectivity (%) | 72.78 | 72.78 | 72.78 | 72.78 | 72.78 |

TABLE 2

Figure 6A:
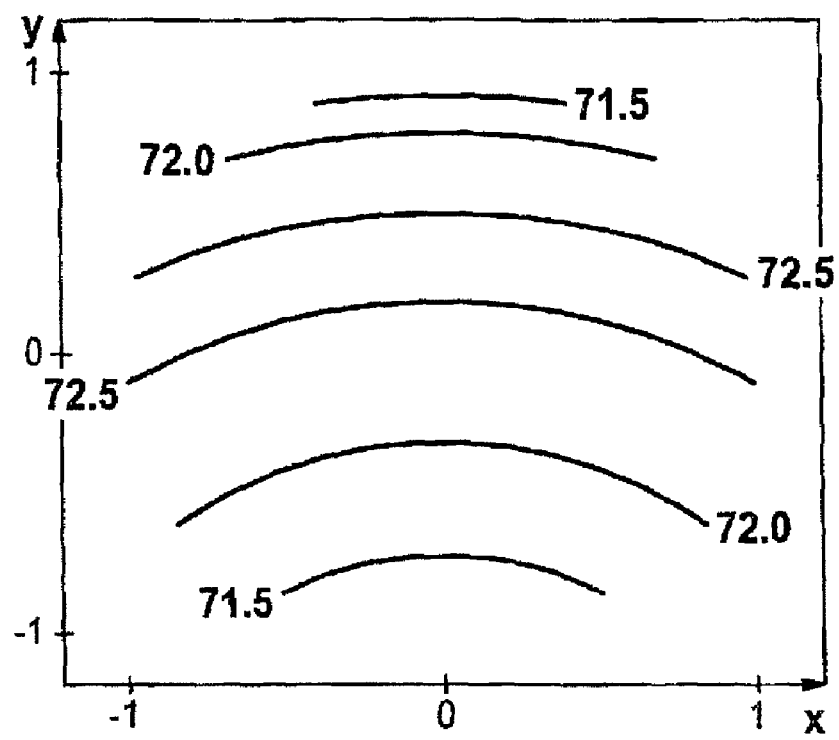
Figure 6B:
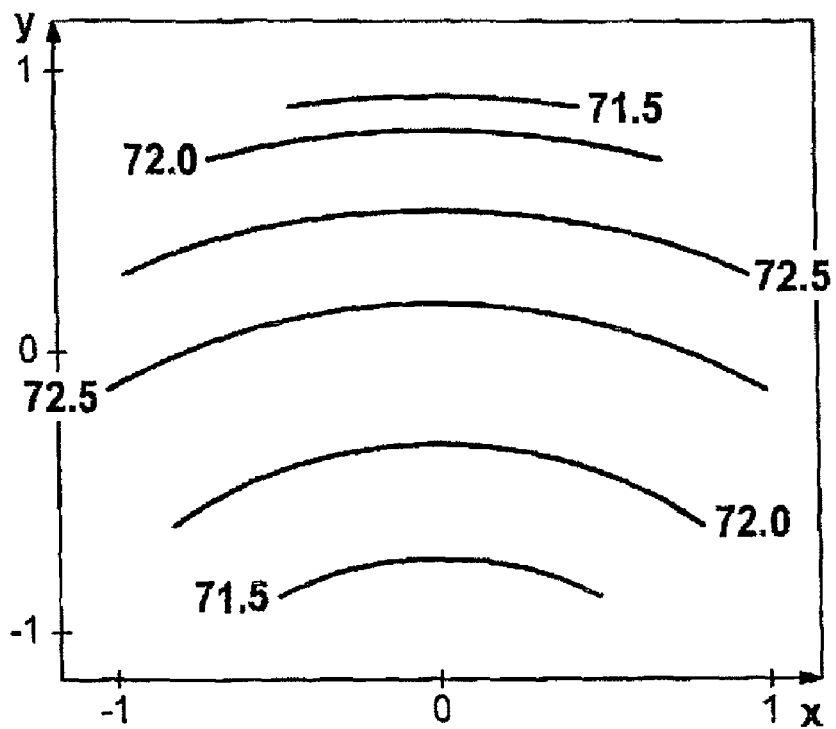
Figure 6C:
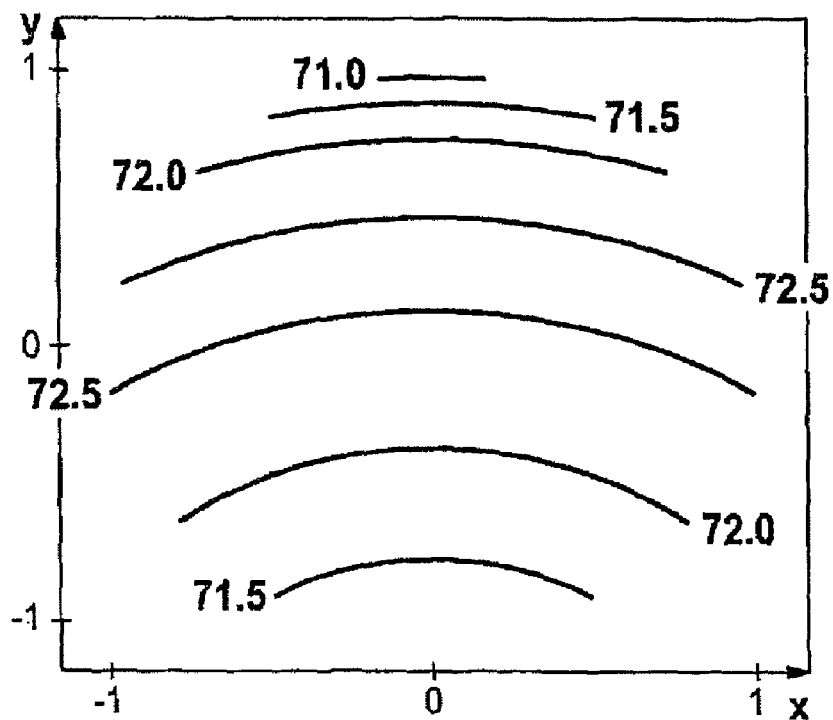
Figure 6D:
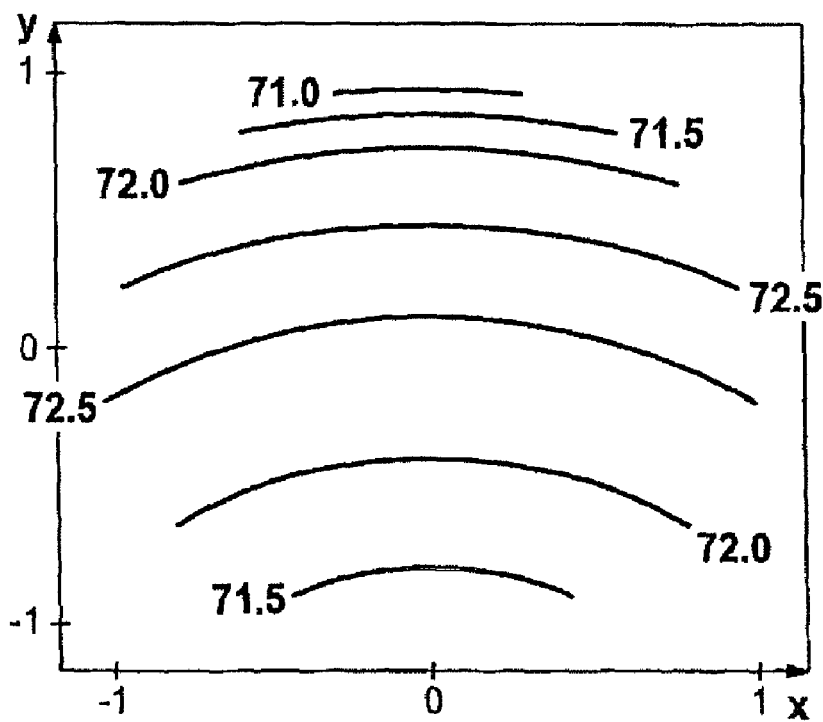
Figure 6E:
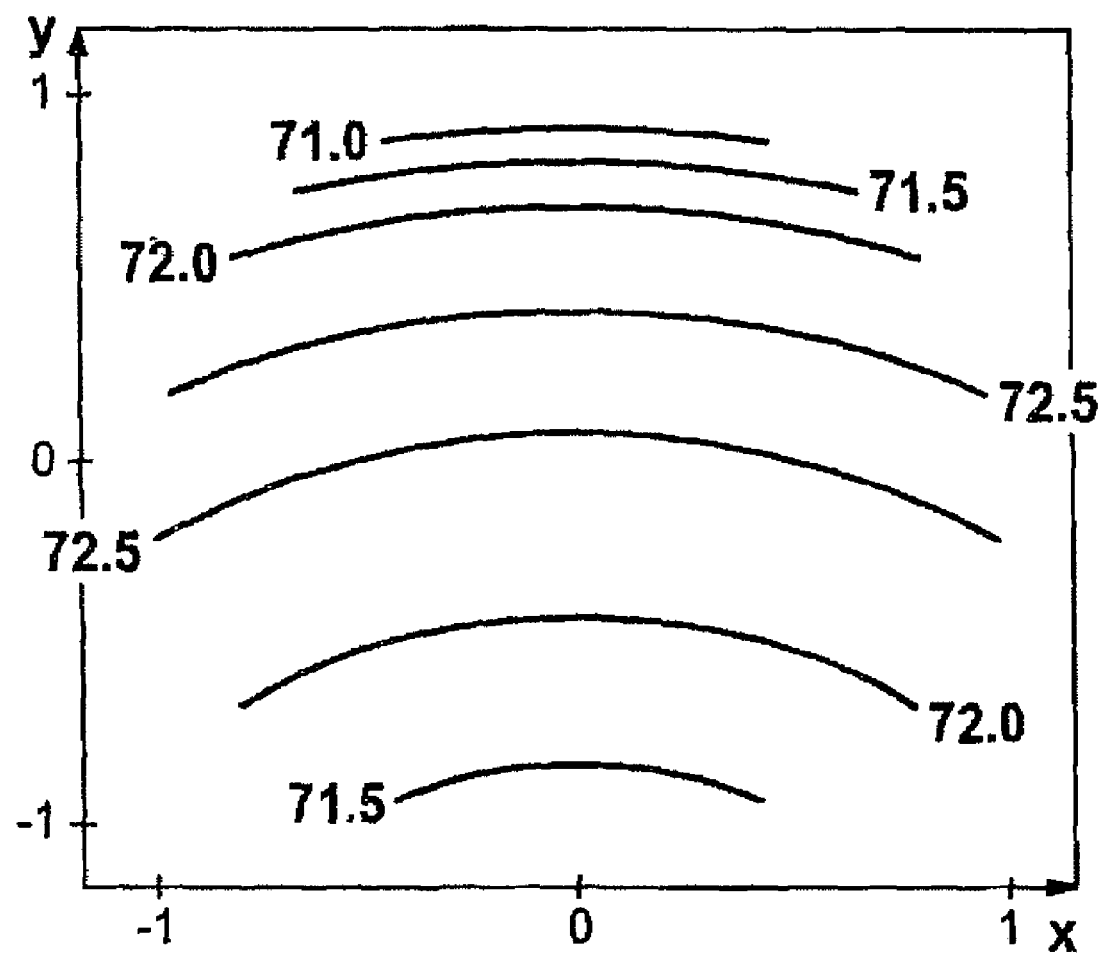

|  | FIG. 6a | FIG. 6b | FIG. 6c | FIG. 6d | FIG. 6e |
| --- | --- | --- | --- | --- | --- |
| Relative field coordinate | (0.00; 0.94) | (0.00; 0.95) | (0.00; 0.97) | (0.00; 0.98) | (0.00; 1.00) |
| Angle | 5.8° | 5.9° | 6.0° | 6.1° | 6.2° |
| Minimum reflectivity (%) | 71.18 | 71.07 | 70.90 | 70.71 | 70.50 |
| Maximum reflectivity (%) | 72.55 | 72.55 | 72.55 | 72.55 | 72.55 |

What is claimed is:

1. A lithography device comprising:
    an illumination system outputting an illumination light;
    a mask having a reflectivity that varies in accordance with an angle of incidence of the illumination light on the mask, the mask thereby reflecting light with angle-dependent variations; and
    a projection system receiving the light reflected by the mask;
    wherein an intensity distribution of the illumination light is adjusted over the angle of incidence by the illumination system to at least partly counteract the angle-dependent variations of the light reflected by the mask.

2. The lithography device according to claim 1, wherein the illumination light is in the extreme ultraviolet or the soft x-ray wavelength region.

3. The lithography device according to claim 1, wherein the illumination system comprises a first optical element having a plurality of first grid elements, the first grid elements being selected to adjust the intensity distribution of the illumination light.

4. The lithography device according to claim 1, wherein the illumination system comprises a first optical element having a plurality of first grid elements, and a second optical element having a plurality of second grid elements, the first and second grid elements being selected to adjust the intensity distribution of the illumination light.

5. The lithography device according to claim 1, wherein the illumination system comprises a first optical element having a plurality of first grid elements, a second optical element having a plurality of second grid elements, and a filter that varies a radiation flux of the illumination light of a subset of at least one of the first and the second grid elements.

6. The lithography device according to claim 1, wherein the projection system produces a homogeneous scan-integrated field and pupil illumination in an image plane of the projection system over a given range of angles of the light reflected by the mask.

7. The lithography device according to claim 1, wherein the reflectivity by the mask of an upper marginal ray and the reflectivity by the mask of a lower marginal ray of a given illumination aperture are at least approximately equal.

8. The lithography device according to claim 1, wherein the illumination system comprises at least one optical element arranged in front of the mask in the beam path, so that pupil apodization effects are at least partly counteracted.

9. The lithography device according to claim 8, wherein the at least one optical element comprises at least one filter.

10. The lithography device according to claim 1, wherein the projection system comprises at least one optical element with a graduated multilayer coating.

11. A lithography device comprising:
    an illumination system;
    a mask; and
    a projection system,
    wherein the illumination system is configured to illuminate the mask inhomogeneously, so that pupil apodization effects are at least partly compensated.

12. The lithography device according to claim 11, wherein the illumination system comprises at least one optical element arranged in front of the mask in the beam path, so that the pupil apodization effects are at least partly compensated.

13. The lithography device according to claim 11, wherein the at least one optical element comprises at least one filter.

14. The lithography device according to claim 11, wherein the projection system comprises at least one optical element with a graduated multilayer coating.

15. The lithography device according to claim 11, wherein the illumination is in the extreme ultraviolet or the soft x-ray wavelength region.

* * * * *

UNITED STATES PATENT AND TRADEMARK OFFICE
CERTIFICATE OF CORRECTION

| | | |
|---|---|---|
| PATENT NO. | : 7,914,955 B2 | Page 1 of 1 |
| APPLICATION NO. | : 12/498226 | |
| DATED | : March 29, 2011 | |
| INVENTOR(S) | : Hans-Juergen Mann et al. | |

It is certified that error appears in the above-identified patent and that said Letters Patent is hereby corrected as shown below:

Column 7, Line 11: delete "13.5nmn." and insert -- 13.5nm. --

Column 7, Line 20: delete "13.5mn" and insert -- 13.5nm --

Signed and Sealed this
Second Day of October, 2012

David J. Kappos
*Director of the United States Patent and Trademark Office*